(12) United States Patent
Roth et al.

(10) Patent No.: US 11,282,916 B2
(45) Date of Patent: Mar. 22, 2022

(54) MAGNETIC THIN FILM INDUCTOR STRUCTURES

(71) Applicant: Taiwan Semiconductor Manufacturing Co., Ltd., Hsinchu (TW)

(72) Inventors: Alan Roth, Leander, TX (US); Eric Soenen, Austin, TX (US); Paul Ranucci, Leander, TX (US)

(73) Assignee: Taiwan Semiconductor Manufacturing Co., Ltd.

( * ) Notice: Subject to any disclaimer, the term of this patent is extended or adjusted under 35 U.S.C. 154(b) by 646 days.

(21) Appl. No.: 15/882,676

(22) Filed: Jan. 29, 2018

(65) Prior Publication Data

US 2018/0219059 A1 Aug. 2, 2018

Related U.S. Application Data

(60) Provisional application No. 62/458,254, filed on Feb. 13, 2017, provisional application No. 62/452,169, filed on Jan. 30, 2017.

(51) Int. Cl.
| | |
|---|---|
| *H01F 27/24* | (2006.01) |
| *H01L 49/02* | (2006.01) |
| *H01F 27/28* | (2006.01) |
| *H01F 17/00* | (2006.01) |

(52) U.S. Cl.
CPC ......... *H01L 28/10* (2013.01); *H01F 17/0013* (2013.01); *H01F 27/24* (2013.01); *H01F 27/28* (2013.01); *H01F 2017/0066* (2013.01)

(58) Field of Classification Search
CPC ..... H01L 28/10; H01F 17/0013; H01F 27/28; H01F 27/24; H01F 2017/0066
See application file for complete search history.

(56) References Cited

U.S. PATENT DOCUMENTS 8,698,585 B2* 4/2014 Takiguchi ............... H01F 27/22
336/61
2013/0120098 A1* 5/2013 Chatani ..................... H01F 3/08
336/212

FOREIGN PATENT DOCUMENTS

JP 07307225 A * 11/1995

* cited by examiner

*Primary Examiner* — Tuyen T Nguyen
(74) *Attorney, Agent, or Firm* — Sterne, Kessler, Goldstein & Fox P.L.L.C.

(57) ABSTRACT

Various magnetic thin film inductor structures are disclosed that include one or more magnetic thin film (MTF) materials. During operation, an electric field passes through one or mare conductive windings which, in turn, generates a magnetic field for storing energy within these magnetic thin film inductor structures. The magnetic thin film (MTF) materials within these magnetic thin film inductor structures effectively attract magnetic flux lines of this magnetic field. As a result, any magnetic leakage resulting from the magnetic field generated by these magnetic thin film inductor structures onto nearby electrical, mechanical, and/or electromechanical devices is lessened when compared to magnetic leakage resulting from the magnetic field generated by other inductor structures not having the one or more MTF materials.

19 Claims, 14 Drawing Sheets

MAGNETIC THIN FILM INDUCTOR STRUCTURES

CROSS-REFERENCE TO RELATED APPLICATIONS

The present application claims the benefit of U.S. Provisional Patent Appl. No. 62/452,169, filed Jan. 30, 2017, and U.S. Provisional Patent Appl. No. 62/458,254, filed Feb. 13, 2017, each of which is incorporated herein by reference in its entirety.

BACKGROUND

The continued improvement of semiconductor fabrication processes has allowed manufacturers and designers to create a smaller and a more powerful electronic device. Semiconductor device fabrication has progressed from a 10 μm semiconductor fabrication process that was reached around 1971 to a 22 nm semiconductor fabrication process that was reached around 2012. The semiconductor device fabrication is expected to further progress onto a 5 nm semiconductor fabrication process around 2019. With each progression of the semiconductor fabrication process, components of the integrated circuits have become smaller to allow more components to be fabricated onto the semiconductor substrate. However, with each progression of the semiconductor fabrication process, new challenges in creating integrated circuits have been uncovered.

One such challenge relates to the fabrication of inductors with newer semiconductor process technologies. Manufactures and designers of inductors have less real estate available on the semiconductor substrate to fabricate their inductors with each newer progression of the semiconductor fabrication process. These manufactures and designers have begun to explore other options that are available with newer semiconductor process technologies to construct inductors that operate in a similar manner as inductors constructed with older semiconductor process technologies without sacrificing performance of their integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
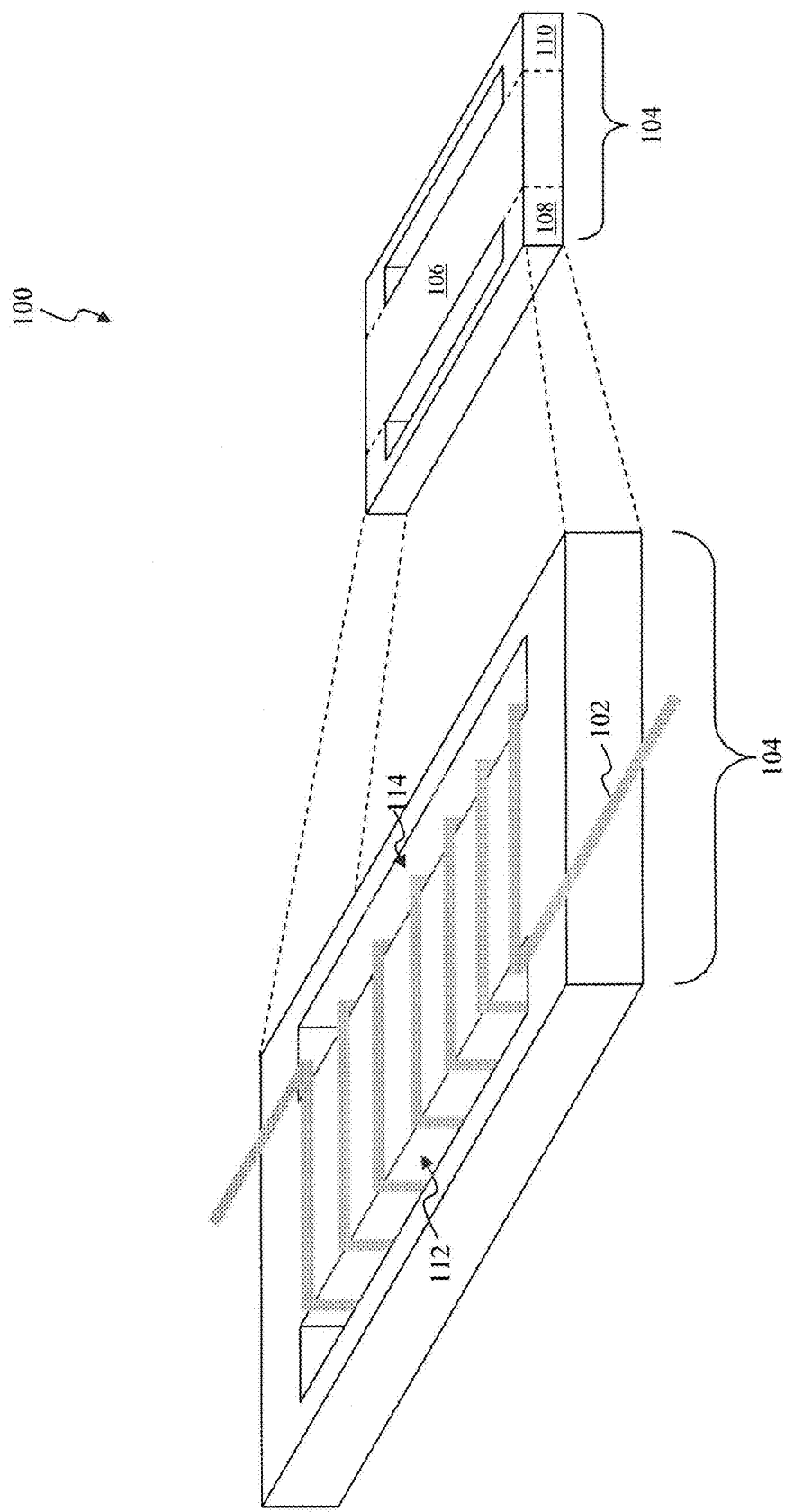
FIG. 1A illustrates a three-dimensional representation, of a first exemplary magnetic thin film inductor structure according to an exemplary embodiment of the present disclosure; and/or the intervening dielectric region 114 can be characterized as being filled with air.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Overview

Various magnetic thin film inductor structures are disclosed that include one or more magnetic thin film (MTF) materials. During operation, an electric field passes through one or more conductive windings which, in turn, generates a magnetic field for storing energy within these magnetic thin film inductor structures. The magnetic thin film (MTF) materials within these magnetic thin film inductor structures effectively attract magnetic flux lines of this magnetic field. As a result, any magnetic leakage resulting from the magnetic field generated by these magnetic thin film inductor structures onto nearby electrical, mechanical, and/or electromechanical devices is lessened when compared to magnetic leakage resulting from the magnetic field generated by other inductor structures not having the one or more MTF materials.

First Exemplary Magnetic Thin Film Inductor Structure

FIG. 1A illustrates a three-dimensional representation of a first exemplary magnetic thin film inductor structure according to an exemplary embodiment of the present disclosure. A magnetic thin film inductor structure 100 represents a passive electrical energy storage device that stores electrical energy in a magnetic field in the presence of an electric current. In the exemplary embodiment illustrated in FIG. 1A, the magnetic thin film inductor structure 100 includes a conductive winding 102 and a magnetic thin film core structure 104. In an exemplary embodiment, the magnetic thin film inductor structure 100 can be fabricated onto a semiconductor substrate using a semiconductor fabrication technique, referred to as being "on-chip," In this exemplary embodiment, the magnetic thin film inductor structure 100 is situated within one or more conductive layers and/or one or more non-conductive layers of a semiconductor layer stack. The one or more conductive layers include one or more conductive materials such as tungsten (W), aluminum (Al), copper (Cu), gold (Au), silver (Ag), or platinum (Pt) to provide some examples. The one or more non-conductive layers include one or more non-conductive materials such as silicon dioxide ($SiO_2$) or nitride ($N^{3-}$) to provide some examples. Also, in this exemplary embodiment, the one or more conductive layers and/or the one or more non-conductive layers of the semiconductor layer stack are situated above, for example, onto, a semiconductor substrate of the semiconductor layer stack. The semiconductor substrate is typically a thin slice of semiconductor material, such as a silicon crystal, but can include other materials, or combinations of materials, such as sapphire or any other suitable material that will be apparent to those skilled in the relevant art(s) without departing from the spirit and scope of the present disclosure.

As illustrated in FIG. 1A, the conductive winding 102 is wound around the magnetic thin film core structure 104 forming multiple windings for the magnetic thin film inductor structure 100. The number of windings of the conductive winding 102 around the magnetic thin film core structure 104 and/or the separation between the windings of the conductive winding 102 around the magnetic thin film core structure 104 as illustrated in FIG. 1A is for illustrative purposes only. Those skilled in the relevant art(s) will recognize other numbers of windings of the conductive winding 102 around the magnetic thin film core structure 104 and/or other separations between the windings of the conductive winding 102 are possible without departing from the spirit and scope of the present disclosure. In an exemplary embodiment, the conductive winding 102 is implemented using one or more conductive materials such as tungsten (W), aluminum (Al), copper (Cu), gold (Au), silver (Ag), or platinum (Pt) to provide some examples; however, those skilled in the relevant art(s) will recognize any suitable conductive material and/or combination of conductive materials can be used without departing from the spirit and scope of the present disclosure.

In the exemplary embodiment illustrated in FIG. 1A, the magnetic thin film core structure 104 is implemented using a magnetic thin film (MTF) material such as a polycrystalline or monocrystalline layer of a ferromagnetic metal, alloy, or magnetic oxide to provide some examples. In an exemplary embodiment, the magnetic thin film core structure 104 can be implemented using a parallel MTF material with magnetic moments from constituent ions of the MTF material being arranged in a substantially similar direction. In some situations, the MTF material can be deposited onto one or more ferromagnetic, ferrimagentic, and/or paramagnetic materials, such as one or more ferromagnetic, ferrimagentic, and/or paramagnetic elements, for example, aluminum (Al), cobalt (Co), iron (Fe), manganese (Mn), nickel (Ni), gadolinium (Gd), dysprosium (Dy), zinc (Zn); one or more ferromagnetic, ferrimagentic, and/or paramagnetic compounds, for example, iron oxide (FeO), chromium oxide ($CrO_2$), manganese arsenide (MnAs), manganese bismuth (MnBi), europium oxide (EuO), nickel oxide (NiO), yttrium iron garnet ($Y_3Fe_5O_{12}$); and/or one or more ferromagnetic, ferrimagentic, and/or paramagnetic mixtures of the one or more elements and/or the one or more ferromagnetic compounds to provide some examples. The one or more ferromagnetic, ferrimagentic, and/or paramagnetic materials can also include one or more solid metals, such as hard or soft iron, silicon steel, mu-metal, permalloy, and supermalloy to provide some examples, one or more powdered metals, such as carbonyl iron or iron powder to provide some examples, and/or one or more ceramics, such as ferrite to provide an example.

As additionally illustrated in FIG. 1A, the magnetic thin film core structure 104 includes a magnetic thin film core 106, a first magnetic thin film core extension 108, and a second magnetic thin film core extension 110. The magnetic thin film core 106, the first magnetic thin film core extension 108, and the second magnetic thin film core extension 110 are electrically and mechanically connected to each other to form the magnetic thin film core structure 104. In the exemplary embodiment illustrated in FIG. 1A, the first magnetic thin film core extension 108 and the second magnetic thin film core extension 110 are situated around a periphery of the magnetic thin film core structure 104. Although the magnetic thin film core 106 is illustrated as being a rectangular parallelepiped in FIG. 1A, those skilled in the relevant art(s) will recognize that other implementations, such as a straight cylindrical rod, an "I" core, a "C" or "U" core, an "E" core, and/or a continuous loop ring or bead to provide some examples, are possible without departing from the spirit and scope of the present disclosure. Even though, the first magnetic thin film core extension 108, and the second magnetic thin film core extension 110 are illustrated as being "C"-shaped in FIG. 1A, those skilled in the relevant art(s) will recognize that other implementations, such as one or more three-dimensional regular closed geometric structures, and/or one or more three-dimensional irregular closed structures, are possible without departing from the spirit and scope of the present disclosure.

As further illustrated in FIG. 1A, the magnetic thin film core structure 104 additionally includes an intervening dielectric region 112 and an intervening dielectric region 114 situated between the magnetic thin film core 106 and the first magnetic thin film core extension 108 and between the magnetic thin film core 106 and the second magnetic thin film core extension 110, respectively. In an exemplary embodiment, the intervening dielectric region 112 and the intervening dielectric region 114 can include one or more dielectric materials such as silicon dioxide ($SiO_2$), nitride ($N^{3-}$), a high dielectric constant (high-κ) material having a large dielectric constant relative to silicon dioxide, such as aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), and/or a low-κ material having a small dielectric constant relative to silicon dioxide, to provide some examples. Alternatively, in another exemplary embodiment, the intervening dielectric region 112 and/or the intervening dielectric region 114 can include no dielectric materials. In this other exemplary embodiment, the intervening dielectric region 112 and/or the intervening dielectric region 114 can be characterized as being filled with air.

Figure 1B:
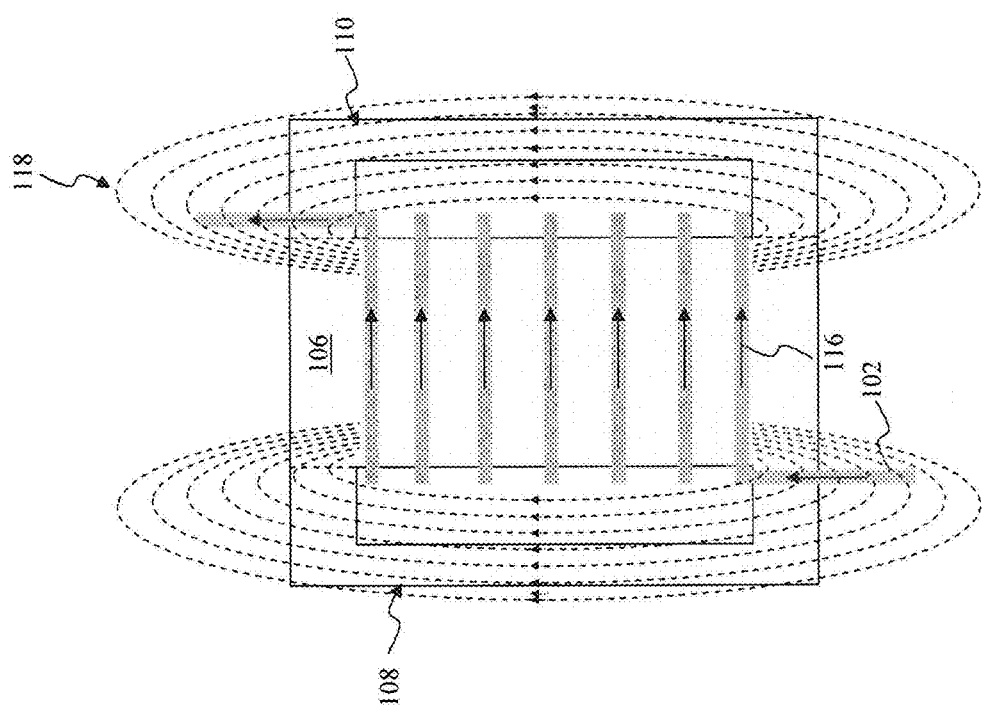
FIG. 1B graphically illustrates, a top-down view of an operation of the first exemplary magnetic thin film inductor structure according to an exemplary embodiment of the present disclosure.

FIG. 1B graphically illustrates a top-down view of an operation of the first exemplary magnetic thin film inductor structure according to an exemplary embodiment of the present disclosure. During operation of the magnetic thin film inductor structure 100, an electric current 116 (illustrated using a pathway of arrows in FIG. 1B) passes through the conductive winding 102 which, in turn, generates a magnetic field for storing energy within the magnetic thin film inductor structure 100. As illustrated in FIG. 1B, the first magnetic thin film core extension 108 and the second magnetic thin film core extension 110 effectively attract magnetic flux lines 118 of this magnetic field. For example, the magnetic thin film material of the first magnetic thin film core extension 108 and the magnetic thin film material of the second magnetic thin film core extension 110 can be characterized as attracting the magnetic flux lines 118 to effectively concentrate the magnetic flux lines 118 to be in the same plane, for example, along a planar surface, as the magnetic thin film core 106. As a result, the magnetic flux lines 118 are less than magnetic flux lines of other inductor structures not including the first magnetic thin film core extension 108 and the second magnetic thin film core extension 110 (not shown in FIG. 1B). As such, any magnetic leakage resulting from the magnetic field generated by the magnetic thin film inductor structure 100 onto nearby electrical, mechanical, and/or electro-mechanical devices is lessened when compared to magnetic leakage resulting from the magnetic field generated by these other inductor structures not including the first magnetic thin film core extension 108 and the second magnetic thin film core extension 110.

Figure 1C:
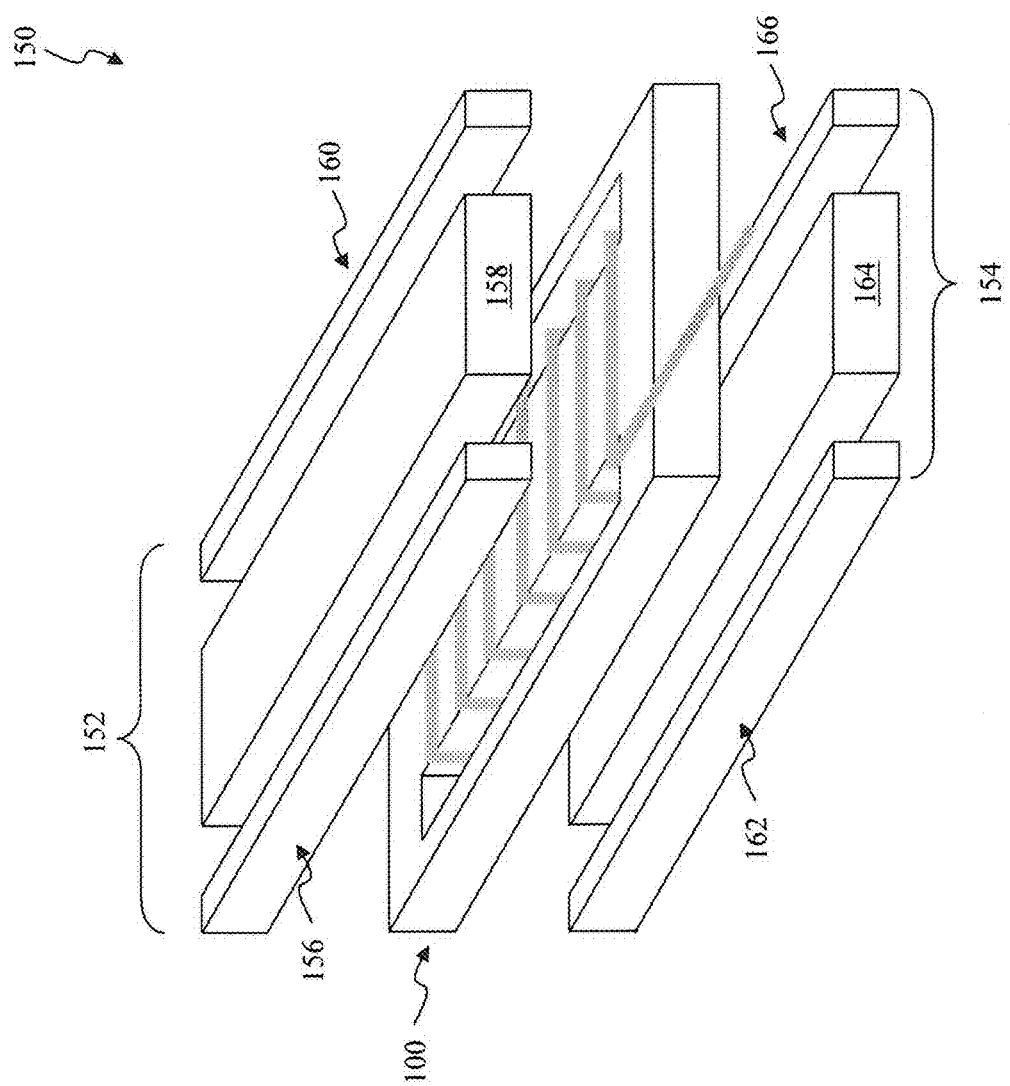
FIG. 1C illustrates a three-dimensional representation of a first exemplary implementation for the first exemplary magnetic thin film inductor structure according to an exemplary embodiment of the present disclosure.

FIG. 1C illustrates a three-dimensional representation of a first exemplary implementation for the first exemplary magnetic thin film inductor structure according to an exemplary embodiment of the present disclosure. In the exemplary embodiment illustrated in FIG. 1C, a magnetic thin film inductor structure 150 includes the magnetic thin film inductor structure 100, and a first magnetic thin film planar structure 152 and/or a second magnetic thin film planar structure 154.

The first magnetic thin film planar structure 152 and/or the second magnetic thin film planar structure 154 can be characterized as further attracting the magnetic flux lines 118 of the magnetic field generated by the electric current 116 passing through the conductive winding 102 of the magnetic thin film inductor structure 100 as discussed above in FIG. 1B. As illustrated in FIG. 1C, the first magnetic thin film planar structure 152 and/or the second magnetic thin film planar structure 154 are situated above and below, respectively, the magnetic thin film inductor structure 100. In an exemplary embodiment, the magnetic thin film inductor structure 150 can be fabricated onto the semiconductor substrate using the semiconductor fabrication technique, referred to as being "on-chip," as discussed above. In this exemplary embodiment, the magnetic thin film inductor structure 150 is situated within the one or more conductive layers and/or the one or more non-conductive layers of the semiconductor layer stack. Also in this exemplary embodiment, the one or more conductive layers and/or the one or more non-conductive layers of the semiconductor layer stack are situated above, for example, onto the semiconductor substrate of the semiconductor layer stack. Further in this exemplary embodiment, the first magnetic thin film planar structure 152 and/or the second magnetic thin film planar structure 154 can be situated above and below, respectively, the magnetic thin film inductor structure 100 in one or more conductive layers and/or one or more non-conductive layers of the layer stack.

Although the first magnetic thin film planar structure 152 and the second magnetic thin film planar structure 154 are illustrated as being rectangular parallelepipeds in FIG. 1C, those skilled in the relevant art(s) will recognize that other implementations, such as one or more three-dimensional regular closed geometric structures, such as one or more three-dimensional regular polygons to provide an example, one or more three-dimensional irregular closed structures, such as one or more three-dimensional irregular polygons to provide an example, and/or any suitable combination of these closed structures, are possible without departing from the spirit and scope of the present disclosure. In an exemplary embodiment, the first magnetic thin film planar structure 152 and/or the second magnetic thin film planar structure 154 can be implemented using the MTF material and/or the parallel MTF material as described above in FIG. 1A. In some situations, the MTF material can be deposited onto the one or more ferromagnetic, ferrimagentic, and/or paramagnetic materials as described above in FIG. 1A.

As illustrated in FIG. 1C, the first magnetic thin film planar structure 152 includes a first thin film planar structure 156, a second thin film planar structure 158, and/or a third thin film planar structure 160 and the second magnetic thin film planar structure 154 similarly includes a first thin film planar structure 162, a second thin film planar structure 164, and/or a third thin film planar structure 166. In the exemplary embodiment illustrated in FIG. 1C the first thin film planar structure 156 and the first thin film planar structure 162 have widths that are similar to a width of the first longitude portion of the first magnetic thin film core extension 108 as discussed above in FIG. 1A. Similarly, the second thin film planar structure 158 and the second thin film planar structure 164 have widths that are similar to a width of the magnetic thin film core 106 in this exemplary embodiment. Likewise in this exemplary embodiment, the third thin film planar structure 160 and the third thin film planar structure 166 have widths that are similar to a width of the second longitude portion of the second magnetic thin film core extension 108 as discussed above in FIG. 1A. Although the first thin film planar structure 156, the second thin film planar structure 158, the third thin film planar structure 160, the first thin film planar structure 162, the second thin film planar structure 164, and the third thin film planar structure 166 are illustrated as being rectangular parallelepipeds in FIG. 1C, those skilled in the relevant art(s) will recognize that other implementations, such as one or more three-dimensional regular closed geometric structures, such as one or more three-dimensional regular polygons to provide an example, one or more three-dimensional irregular closed structures, such as one or more three-dimensional irregular polygons to provide an example, and/or any suitable combination of these closed structures, are possible without departing from the spirit and scope of the present disclosure.

Figure 1D:
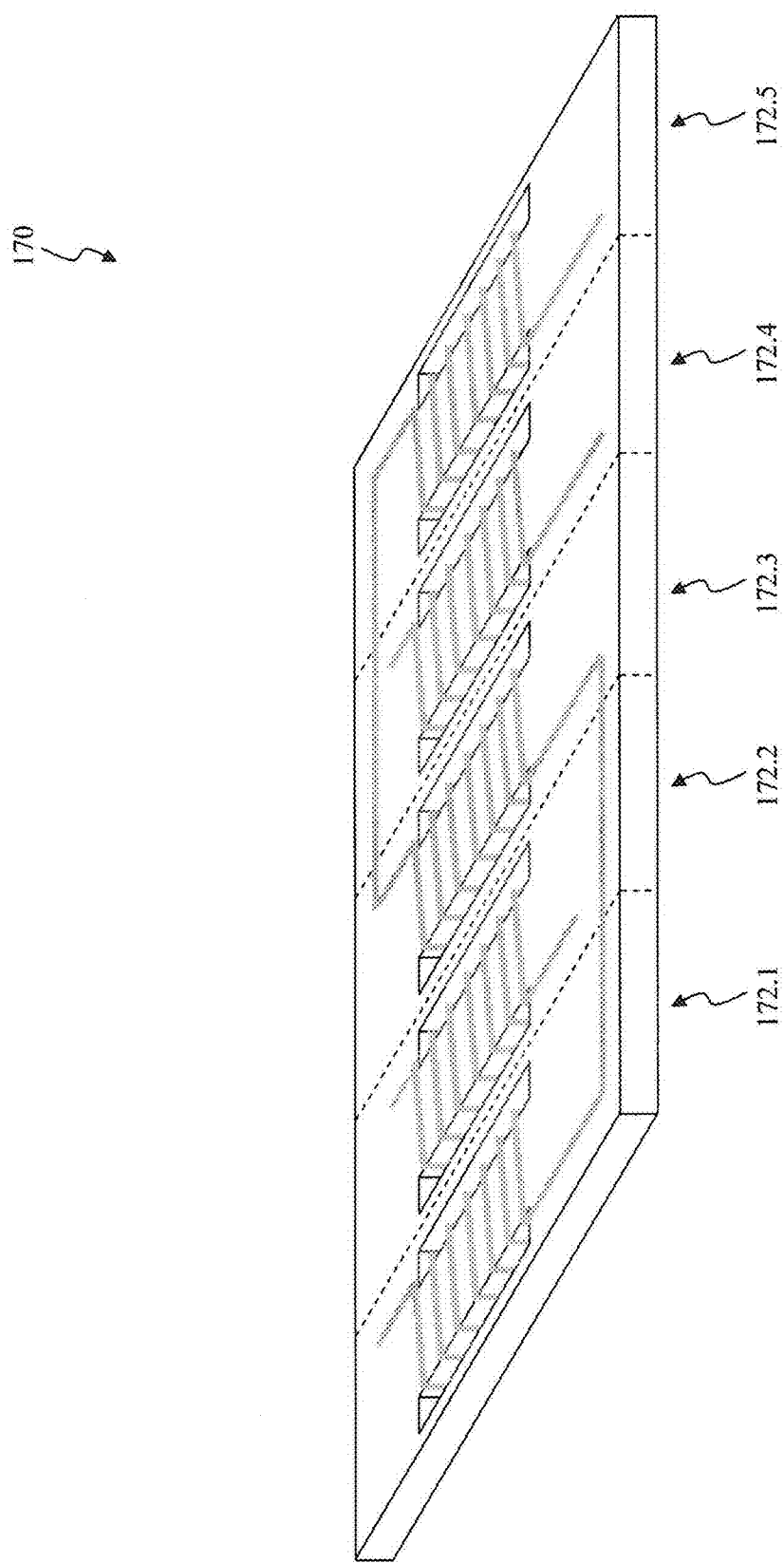
FIG. 1D and FIG. 1E illustrate three-dimensional representations of a second exemplary implementation and a third exemplary implementations, respectively, for the first exemplary magnetic thin film inductor structure according to exemplary embodiments of the present disclosure.
Figure 1E:
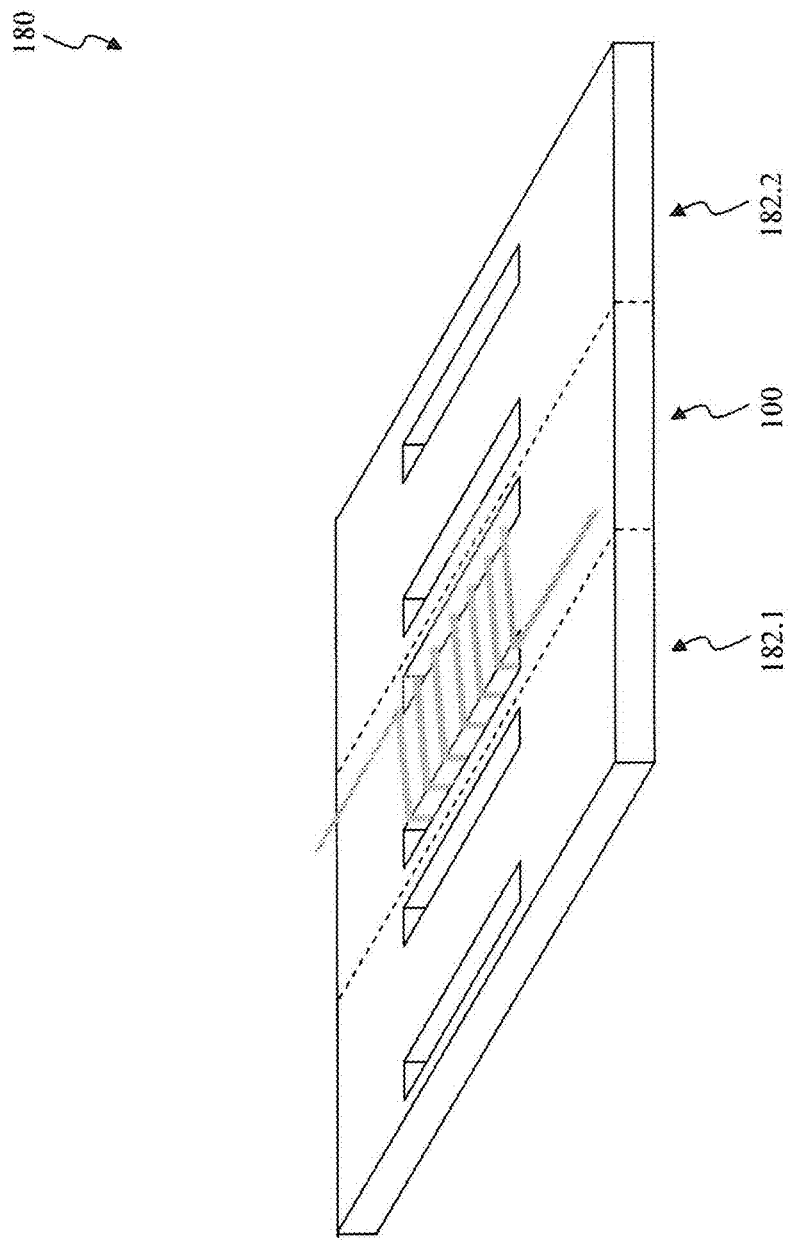

FIG. 1D and FIG. 1E illustrate three-dimensional representations of a second exemplary implementation and a third exemplary implementations, respectively, for the first exemplary magnetic thin film inductor structure according to exemplary embodiments of the present disclosure. As illustrated in FIG. 1D, a magnetic thin film inductor structure 170 includes magnetic thin film inductor structures 172.1 through 172.5, each of which can represent an exemplary embodiment of the magnetic thin film inductor structure 100 having at least the conductive windings 102 and the magnetic thin film core structure 104 including the first magnetic thin film core extension 108, and the second magnetic thin film core extension 110 as discussed above in FIG. 1A. The magnetic thin film inductor structures 172.1 through 172.5 are electrically and mechanically connected to each other to form the magnetic thin film core structure 170. Although the magnetic thin film inductor structure 170 is illustrated as including the magnetic thin film inductor structures 172.1 through 172.5 in FIG. 1D, this is for illustrative purposes only. Those skilled in the relevant art(s) will recognize other numbers for magnetic thin film inductor structures 172.1 through 172.5 are possible without departing from the spirit and scope of the present disclosure.

Additionally, as illustrated in FIG. 1D, the conductive windings 102 of one or more of magnetic thin film inductor structures 172.1 through 172.5 can be electrically and mechanically connected to each other to form other magnetic thin film inductor structures having greater numbers of windings than the magnetic thin film inductor structure 100. For example, the conductive windings 102 of the magnetic thin film inductor structures 172.1, 172.3, and 172.5 are electrically and mechanically connected to form a first magnetic thin film inductor structure having a greater number of windings than a second magnetic thin film inductor structure and a third magnetic thin film inductor structure formed by the magnetic thin film inductor structure 172.2 and magnetic thin film inductor structure 172.4, respectively.

During operation of the first magnetic thin film inductor, namely the magnetic thin film inductor structures 172.1, 172.3, and 172.5, the electric current 116 passes through the conductive winding 102 of magnetic thin film inductor structures 172.1, 172.3, and 172.5, which, in turn, generates the magnetic field for storing energy within the first magnetic thin film inductor as described above in FIG. 1B. The magnetic thin film inductor structures 172.2 and 172.4 further attract the magnetic flux lines 118 of the magnetic field generated by the electric current 116 passing through the conductive winding 102 of the first magnetic thin film inductor as discussed above in FIG. 1B. This attraction of the magnetic flux lines lessens magnetic leakage resulting from the magnetic field generated by the first magnetic thin film inductor onto the second magnetic thin film inductor structure and the third magnetic thin film inductor structure, namely the magnetic thin film inductor structures 172.2 and 172.4.

In the exemplary embodiment illustrated in FIG. 1E, the magnetic thin film inductor structure 180 includes the magnetic thin film inductor structure 100 situated between a first magnetic thin film core structure 182.1 and a second magnetic thin film core structure 182.2. In an exemplary embodiment, the first magnetic thin film core structure 182.1 and the second magnetic thin film core structure 182.2 can represent exemplary embodiments of the magnetic thin film core structure 104 as discussed above in FIG. 1A. The magnetic thin film inductor structure 100, the first magnetic thin film core structure 182.1, and the second magnetic thin film core structure 182.2 are electrically and mechanically connected to each other to form the magnetic thin film core structure 180. Although the magnetic thin film inductor structure 180 is illustrated as including the first magnetic thin film core structure 182.1 and the second magnetic thin film core structure 182.2 in FIG. 1E, this is for illustrative purposes only. Those skilled in the relevant art(s) will recognize more or less magnetic thin film core structures 182 are possible for the magnetic thin film inductor structure 180 without departing from the spirit and scope of the present disclosure.

During operation of the magnetic thin film inductor structure 100, the electric current 116 passes through the conductive winding 102 of the magnetic thin film inductor structure 100, which, in turn, generates the magnetic field for storing energy within the magnetic thin film inductor structure 100 as described above in FIG. 1B. The first magnetic thin film core structure 182.1 and the second magnetic thin film core structure 182.2 further attract the magnetic flux lines 118 of the magnetic field generated by the electric current 116 passing through the conductive winding 102 of the magnetic thin film inductor structure 100 as discussed above in FIG. 1B. This attraction of the magnetic flux lines lessens magnetic leakage resulting from the magnetic field generated by the magnetic thin film inductor structure 180 onto nearby electrical, mechanical, and/or electro-mechanical devices.

Second Exemplary Magnetic Thin Film Inductor Structure

Figure 2A:
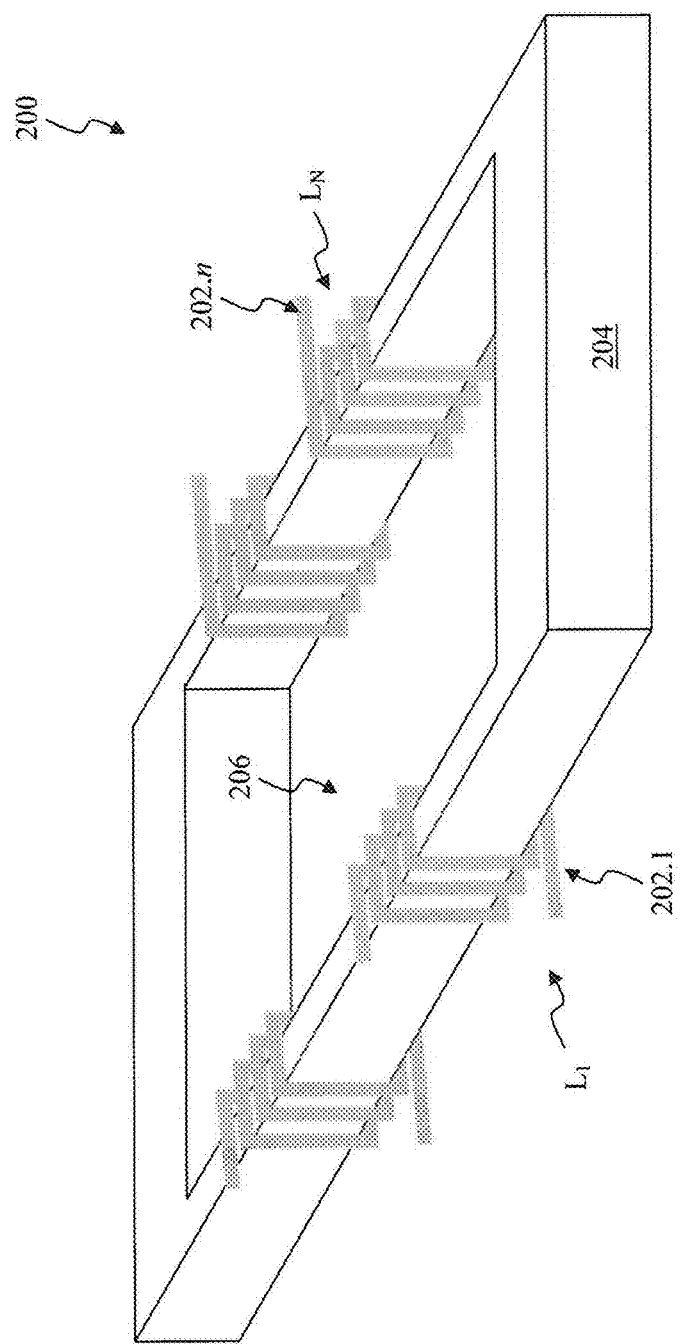
FIG. 2A illustrates a three-dimensional representation of a second exemplary magnetic thin film inductor structure according to an exemplary embodiment of the present disclosure.

FIG. 2A illustrates a three-dimensional representation of a second exemplary magnetic thin film inductor structure according to an exemplary embodiment of the present disclosure. A magnetic thin film inductor structure 200 represents a passive electrical energy storage device that stores electrical energy in magnetic fields in the presence of electric currents. In the exemplary embodiment illustrated in FIG. 2A, the magnetic thin film inductor structure 200 includes conductive windings 202.1 through 202.n and a magnetic thin film core structure 204. In an exemplary embodiment, the magnetic thin film inductor structure 200 can be fabricated onto the semiconductor substrate using the semiconductor fabrication technique in a substantially similar manner as the magnetic thin film inductor structure 100 as discussed above in FIG. 1A.

As illustrated in FIG. 2A, the conductive windings 202.1 through 202.n are wound around the magnetic thin film core structure 204 forming multiple windings of the conductive windings 202.1 through 202.n around the magnetic thin film core structure 204 to provide inductors $L_1$ through $L_N$. In an exemplary embodiment, the conductive windings 202.1 through 202.n are implemented using one or more conductive materials such as tungsten (W), aluminum (Al), copper (Cu), gold (Au), silver (Ag), or platinum (Pt) to provide some examples; however, those skilled in the relevant art(s) will recognize any suitable conductive material and/or combination of conductive materials can be used without departing from the spirit and scope of the present disclosure. In the exemplary embodiment illustrated in FIG. 2A, the conductive windings 202.1 through 202.n are wound around at least two parallel sides of a periphery of the magnetic thin film core structure 204. The number of windings of the conductive windings 202.1 through 202.n around the magnetic thin film core structure 204 and/or the separation between the windings of windings 202.1 through 202.n around the magnetic thin film core structure 204 as illustrated in FIG. 2A is for illustrative purposes only. Those skilled in the relevant art(s) will recognize other numbers of windings of the conductive windings 202.1 through 202.n around the magnetic thin film core structure 204 and/or other separations between the windings of the conductive windings 202.1 through 202.n are possible without departing from the spirit and scope of the present disclosure.

As discussed above, the conductive windings 202.1 through 202.n are wound around the magnetic thin film core structure 204. Although the magnetic thin film core structure 204 is illustrated as being a straight toroid in FIG. 2A, those skilled in the relevant art(s) will recognize that other implementations, such as a straight cylindrical rod, an "I" core, a "C" or "U" core, an "E" core, and/or a continuous loop ring or bead to provide some examples, are possible without departing from the spirit and scope of the present disclosure. In the exemplary embodiment illustrated in FIG. 2A, the magnetic thin film core structure 204 is implemented using the magnetic thin film (MTF) material as described above in FIG. 1A. In an exemplary embodiment, the magnetic thin film core structure 204 can be implemented using the parallel MTF material as described above in FIG. 1A. In some situations, the MTF material can be deposited onto the one or more ferromagnetic, ferrimagentic, and/or paramagnetic materials as described above in FIG. 1A.

As further illustrated in FIG. 2A, the magnetic thin film core structure 204 additionally includes a dielectric region 206 within the magnetic thin film core structure 204. In an exemplary embodiment, the magnetic thin film core structure 204 can include one or more dielectric materials such as silicon dioxide ($SiO_2$), nitride ($N^{3-}$), a high dielectric constant (high-κ) material having a large dielectric constant relative to silicon dioxide, such as aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), and/or a low-κ material having a small dielectric constant relative to silicon dioxide, to provide some examples. Alternatively, in another exemplary embodiment, the magnetic thin film core structure 204 can include no dielectric materials. In this other exemplary embodiment, the magnetic thin film core structure 204 can be characterized as being filled with air.

Figure 2B:
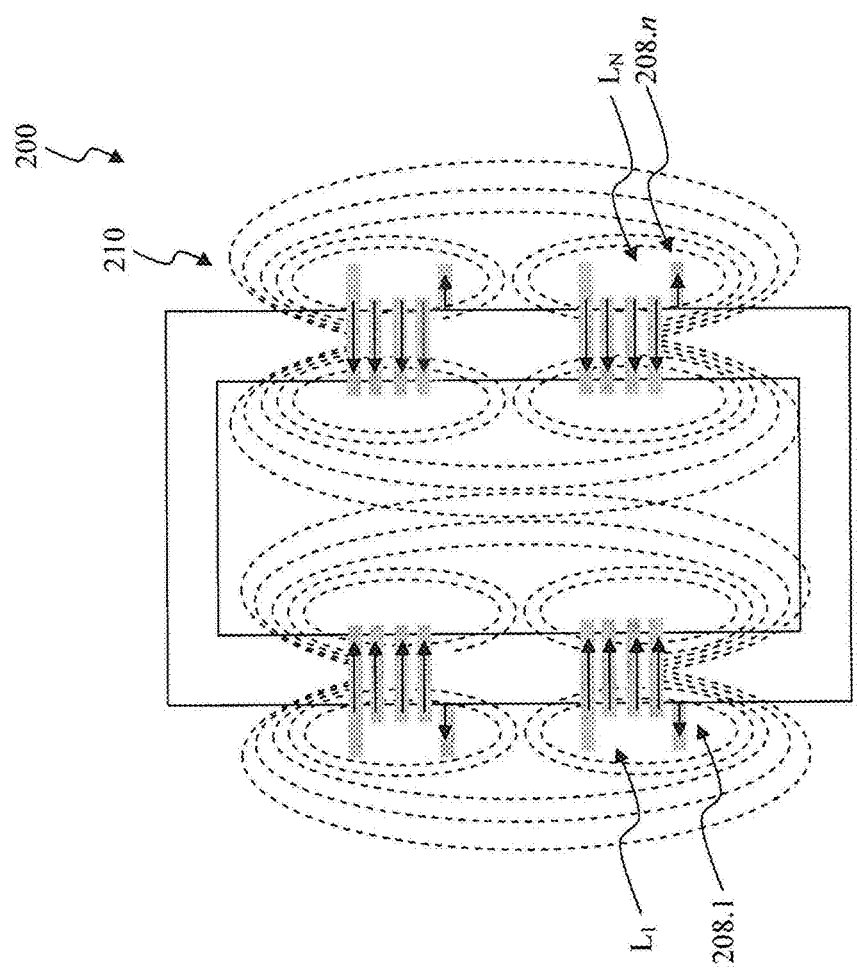
FIG. 2B graphically illustrates an operation of the second exemplary magnetic thin film inductor structure according to an exemplary embodiment of the present disclosure.

FIG. 2B graphically illustrates an operation of the second exemplary magnetic thin film inductor structure according to an exemplary embodiment of the present disclosure. As illustrated in FIG. 2B, the magnetic thin film inductor structure 200 generates the magnetic field, illustrated using magnetic flux lines 210 flowing from a north pole of the magnetic thin film core 204 to a south pole of the magnetic thin film core 204, when electric currents 208.1 through 208.n are passing through the conductive windings 202.1 through 202.n. In the exemplary embodiment illustrated in FIG. 2B, the magnetic flux lines 210 are steered toward the magnetic thin film core 204. For example, the magnetic thin film material of the magnetic thin film core 204 can be characterized as attracting the magnetic flux lines 210 to effectively concentrate the magnetic flux lines 210 to be in the same plane, for example, along a planar surface, as the magnetic thin film core 204. As a result, the magnetic field generated by the magnetic thin film inductor structure 200 including the magnetic thin film core 204 is less than a magnetic field generated by a magnetic thin film inductor structure not including the magnetic thin film core 204. As such, any magnetic leakage resulting from the magnetic field generated by the magnetic thin film inductor structure 200 onto nearby electrical, mechanical, and/or electro-mechanical devices is lessened when compared to magnetic leakage resulting from the magnetic field generated by the magnetic thin film inductor structure not including the magnetic thin film core 204.

Figure 2C:
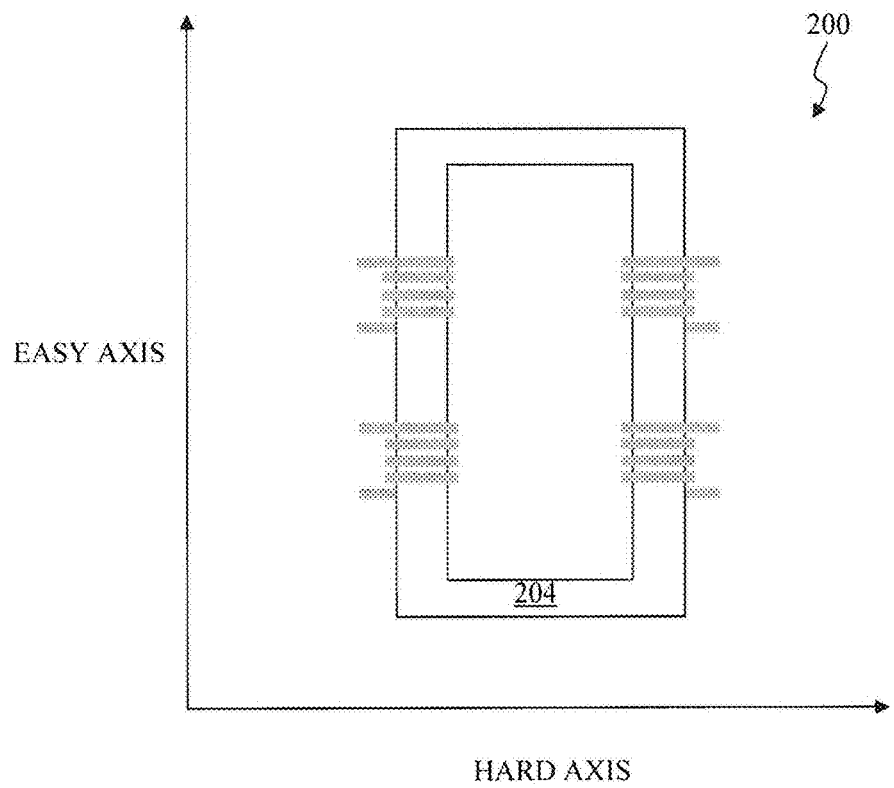
FIG. 2C illustrates a first exemplary implementation for the second exemplary magnetic thin film inductor structure according to an exemplary embodiment of the present disclosure.

FIG. 2C illustrates a first exemplary implementation for the second exemplary magnetic thin film inductor structure according to an exemplary embodiment of the present disclosure. In the exemplary embodiment illustrated in FIG. 2C, the magnetic thin film core 204 is implemented using a magnetically anisotropic material, such as the elements iron (Fe), cobalt (Co), terbium (Tb), manganese (Mn), compounds including these elements, and/or mixtures including these elements to provide some examples. The magnetic anisotropic material can be characterized as having, a preferential directional dependence of magnetic properties. Generally, an "easy axis" as illustrated in FIG. 2C represents an energetically advantageous direction of magnetization while a "hard axis" as illustrated in FIG. 2C represents an energetically disadvantageous direction of magnetization. For example, magnetic moments of the magnetically anisotropic material of the magnetic thin film core 204 have tendencies to align with the "easy axis" and to oppose the "hard axis."

In the exemplary embodiment illustrated in FIG. 2C, the magnetic thin film inductor structure 200 can be characterized as having the "easy axis" along the least two parallel sides of a periphery of the magnetic thin film core structure 204 having the inductors $L_1$ through $L_N$. As illustrated in FIG. 2C, the inductors $L_1$ through $L_N$ are situated along, namely, parallel to, the "easy axis" of the magnetic thin film core 204 and perpendicular to the "hard axis" of the magnetic thin film core 204. Although not illustrated in FIG. 2C, if some of the inductors $L_1$ through $L_N$ were to be situated along, namely, parallel to, the "hard axis" of the magnetic thin film core 204 and perpendicular to the "easy axis" of the magnetic thin film core 204, the tendencies of the magnetic moments of the magnetic thin film core 204 to align with "easy axis" of the magnetic thin film core 204 can degrade performance for these inductors. For example, less electric current is needed to pass through the inductors $L_1$ through $L_N$ situated along the "easy axis." to generate a magnetic field to store energy in these inductors when compared to the conductive windings 102 of inductors situated along the "hard axis."

In some situations, the magnetic thin film inductor structure 200 can be fabricated onto the semiconductor substrate using the semiconductor fabrication technique in a substantially similar manner as the magnetic thin film inductor structure 100 as discussed above in FIG. 1A. In these situations, the semiconductor fabrication technique can use a deposition technique, such as chemical deposition or physical deposition to provide some examples, to deposit the magnetically anisotropic material onto the semiconductor substrate in such a manner as to exhibit the magnetization profile as illustrated in FIG. 2C. However, if the semiconductor substrate and/or the mechanism for depositing the magnetically anisotropic material are rotated by a deposition angle a different magnetization profile can result as to be discussed in FIG. 2D.

Figure 2D:
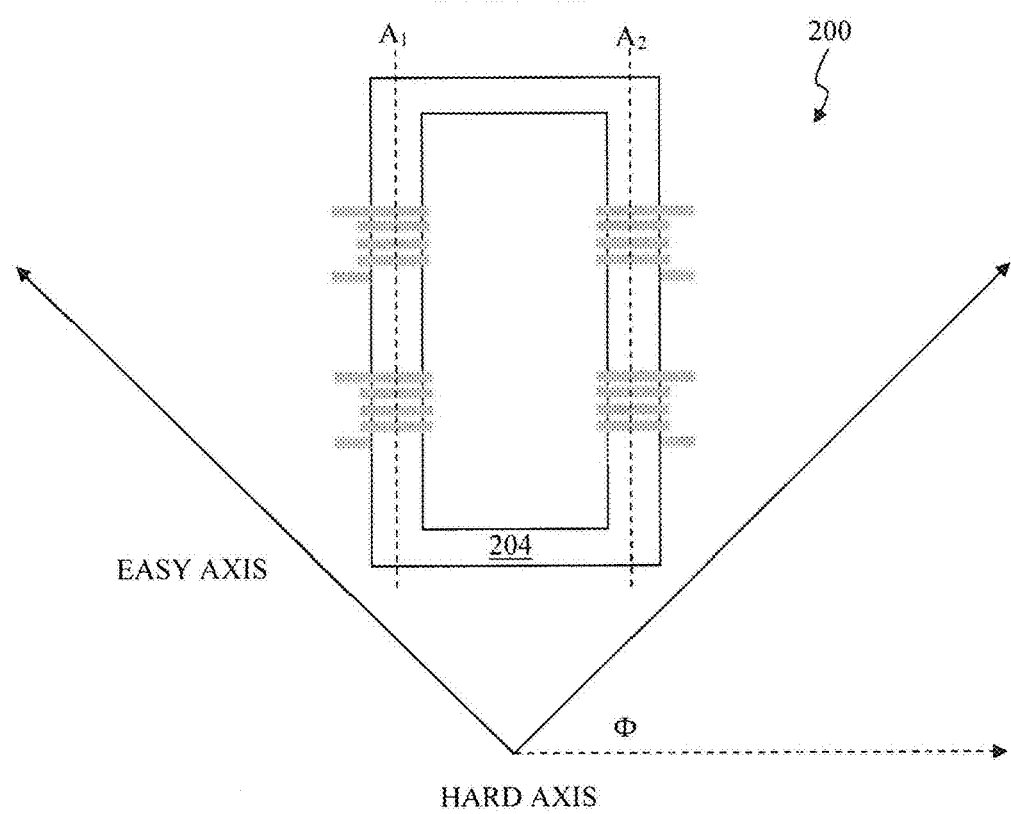
FIG. 2D illustrates a second exemplary implementation for the second exemplary magnetic thin film inductor structure according to an exemplary embodiment of the present disclosure.

FIG. 2D illustrates a second exemplary implementation for the second exemplary magnetic thin film inductor structure according to an exemplary embodiment of the present disclosure. In the exemplary embodiment illustrated in FIG. 2D, the magnetic thin film core 204 is implemented using the magnetically anisotropic material as discussed above in FIG. 2C. As illustrated in FIG. 2D, the "easy axis" and the "hard axis" are offset by a deposition angle Φ when compared to the "easy axis" and the "hard axis" as discussed above in FIG. 2C. For example, the inductors $L_1$ through $L_N$ are situated along axes $A_1$ and $A_2$ that are offset from the "easy axis" and the "hard axis" by the deposition angle Φ. In an exemplary embodiment, the semiconductor substrate and/or the mechanism for depositing the magnetically anisotropic material are arranged to be offset by the deposition angle Φ when the thin film magnetic material is deposited onto the semiconductor substrate by the semiconductor fabrication technique. This rotation of the semiconductor substrate and/or the magnetic thin film core 204 causes an approximately similar rotation of the "easy axis" and the "hard axis" of the magnetic thin film core 204 as illustrated in FIG. 2D. As a result of this rotation of the "easy axis" and the "hard axis" by the deposition angle Φ, conductive windings can be placed around entirety of the periphery of the magnetic thin film core structure 204 as to be described below in FIG. 2E and FIG. 2F.

Figure 2E:
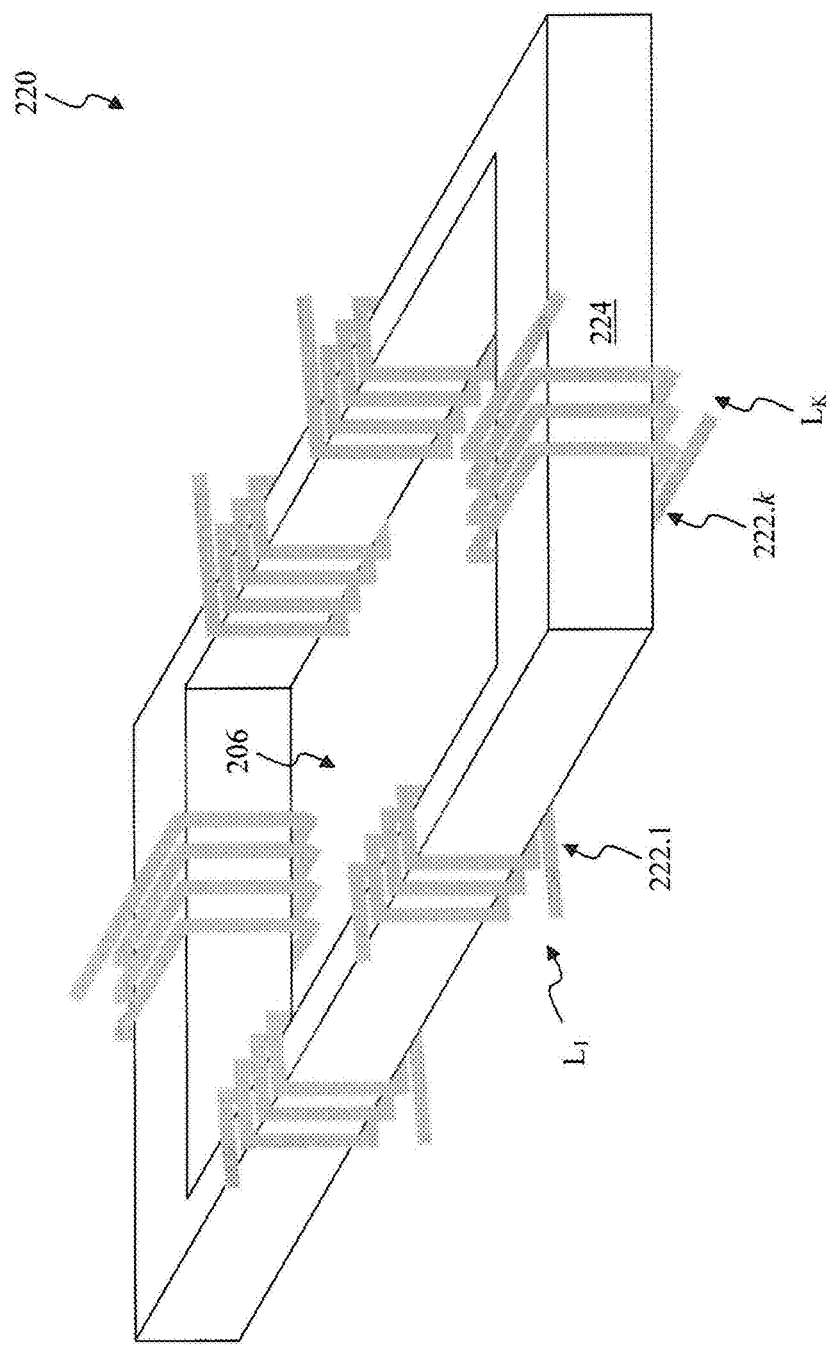
FIG. 2E and FIG. 2F illustrate three-dimensional representations of a third exemplary implementation and a fourth exemplary implementations, respectively, for the second exemplary magnetic thin film inductor structure according to exemplary embodiments of the present disclosure.
Figure 2F:
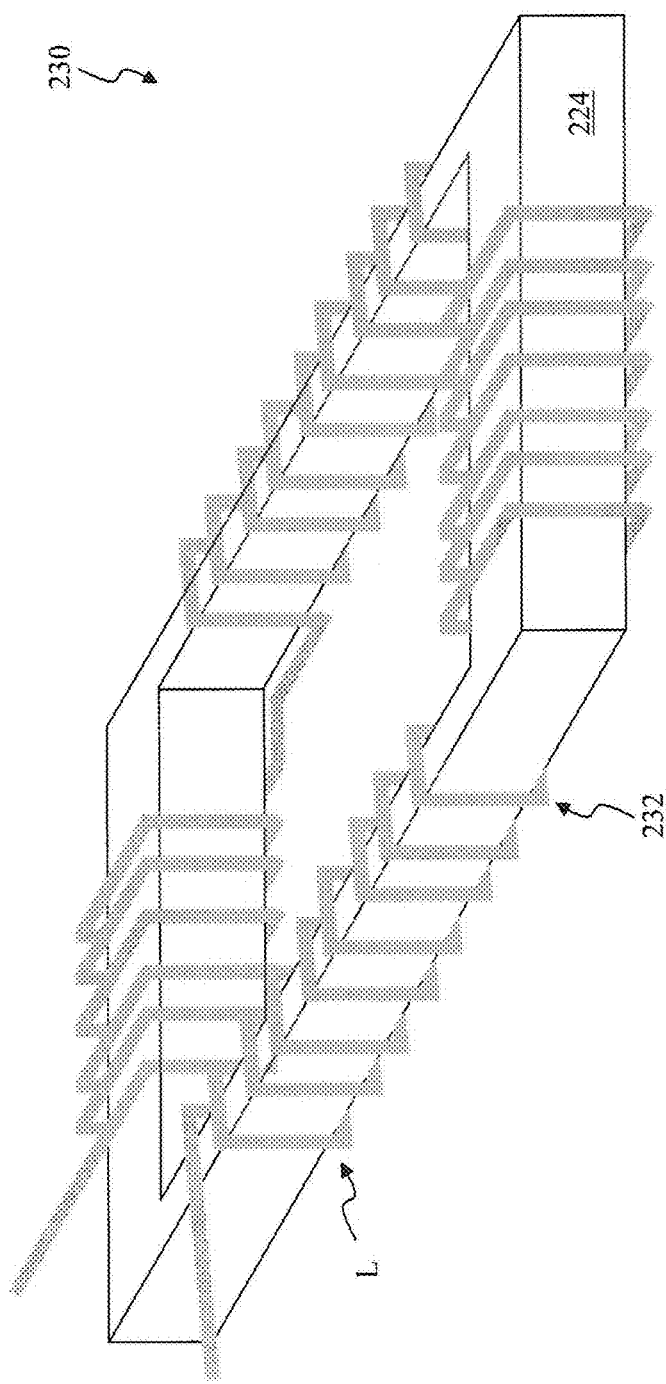

FIG. 2E and FIG. 2F illustrate three-dimensional representations of a third exemplary implementation and a fourth exemplary implementations, respectively, for the second exemplary magnetic thin film inductor structure according to exemplary embodiments of the present disclosure. Specifically, FIG. 2E illustrates multiple inductors $L_1$ through $L_N$ wound around a magnetic thin film core structure 224 and FIG. 2F illustrates a single inductor L wound around the magnetic thin film core structure 224. As illustrated in FIG. 2E, a magnetic thin film inductor structure 220 represents a passive electrical energy storage device that stores electrical energy in magnetic fields in the presence of electric currents. In the exemplary embodiment illustrated in FIG. 2E, the magnetic thin film inductor structure 220 includes conductive windings 222.1 through 222.k and the magnetic thin film core structure 224. In an exemplary embodiment, the magnetic thin film inductor structure 220 can be fabricated onto the semiconductor substrate using the semiconductor fabrication technique in a substantially similar manner as the magnetic thin film inductor structure 100 as discussed above in FIG. 1A.

As illustrated in FIG. 2E, the conductive windings 222.1 through 222.k are wound around the magnetic thin film core structure 224 forming multiple windings of the conductive windings 222.1 through 222.k around the magnetic thin film core structure 224 to provide inductors $L_1$ through $L_K$. In an exemplary embodiment, the conductive windings 222.1 through 222.k are implemented using one or more conductive materials such as tungsten (W), aluminum (Al), copper (Cu), gold (Au), silver (Ag), or platinum (Pt) to provide some examples; however, those skilled in the relevant art(s) will recognize any suitable conductive material and/or combination of conductive materials can be used without departing from the spirit and scope of the present disclosure. In the exemplary embodiment illustrated in FIG. 2E, the magnetic thin film core structure 224 includes the magnetically anisotropic material as discussed above in FIG. 2A having the "easy axis" and the "hard axis" offset by the deposition angle Φ as discussed above in FIG. 2C. This allows the conductive windings 222.1 through 222.k to be wound around a periphery of the magnetic thin film core structure 224. Although the magnetic thin film core structure 224 is illustrated as being a straight toroid in FIG. 2E, those skilled in the relevant art(s) will recognize that other implementations, such as a straight cylindrical rod, an "I" core, a "C" or "U" core, an "E" core, and/or a continuous loop ring or bead to provide some examples, are possible without departing from the spirit and scope of the present disclosure. Moreover, the number of windings of the conductive windings 222.1 through 222.k around the magnetic thin film core structure 224 and/or the separation between the windings of windings 222.1 through 222.k around the magnetic thin film core structure 224 as illustrated in FIG. 2E is for illustrative purposes only. Those skilled in the relevant art(s) will recognize other numbers of windings of the conductive windings 222.1 through 222.k around the magnetic thin film core structure 224 and/or other separations between the windings of the conductive windings 222.1 through 222.k are possible without departing from the spirit and scope of the present disclosure.

As further illustrated in FIG. 2E, the magnetic thin film core structure 224 additionally includes the dielectric region 206 as discussed above in FIG. 2A.

As illustrated in FIG. 2F a magnetic thin film inductor structure 230 represents a passive electrical energy storage device that stores electrical energy in a magnetic field in the presence of an electric current. In the exemplary embodiment illustrated in FIG. 2F, the magnetic thin film inductor structure 230 includes conductive winding 232 and the magnetic thin film core structure 224. In an exemplary embodiment, the magnetic thin film inductor structure 230 can be fabricated onto the semiconductor substrate using the semiconductor fabrication technique in a substantially similar manner as the magnetic thin film inductor structure 100 as discussed above in FIG. 1A.

As illustrated in FIG. 2F, the conductive winding 232 is wound around the magnetic thin film core structure 224 forming multiple windings of the conductive winding 232 around the magnetic thin film core structure 224 to provide an inductor L. In an exemplary embodiment, the conductive winding 232 is implemented using one or more conductive materials such as tungsten (W), aluminum (Al), copper (Cu), gold (Au), silver (Ag), or platinum (Pt) to provide some examples; however, those skilled in the relevant art(s) will recognize any suitable conductive material and/or combination of conductive materials can be used without departing from the spirit and scope of the present disclosure. In the exemplary embodiment illustrated in FIG. 2F, the magnetic thin film core structure 224 includes the magnetically anisotropic material as discussed above in FIG. 2A having the "easy axis" and the "hard axis" offset by the deposition angle CD as discussed above in FIG. 2C. This allows conductive winding 232 to be wound around a periphery of the magnetic thin film core structure 224. Although the magnetic thin film core structure 224 is illustrated as being a straight torpid in FIG. 2F, those skilled in the relevant art(s) will recognize that other implementations, such as a straight cylindrical rod, an "I" core, a "C" or "U" core, an "E" core, and/or a continuous loop ring or bead to provide some examples, are possible without departing from the spirit and scope of the present disclosure. Moreover, the number of windings of the conductive winding 232 around the magnetic thin film core structure 224 and/or the separation between the windings of windings 222.1 through 222.k around the magnetic thin film core structure 224 as illustrated in FIG. 2F is for illustrative purposes only. Those skilled in the relevant art(s) will recognize other numbers of windings of the conductive winding 232 around the magnetic thin film core structure 224 and/or other separations between the windings of the conductive winding 232 are possible without departing from the spirit and scope of the present disclosure.

Third Exemplary Magnetic Thin Film Inductor Structure

Figure 3A:
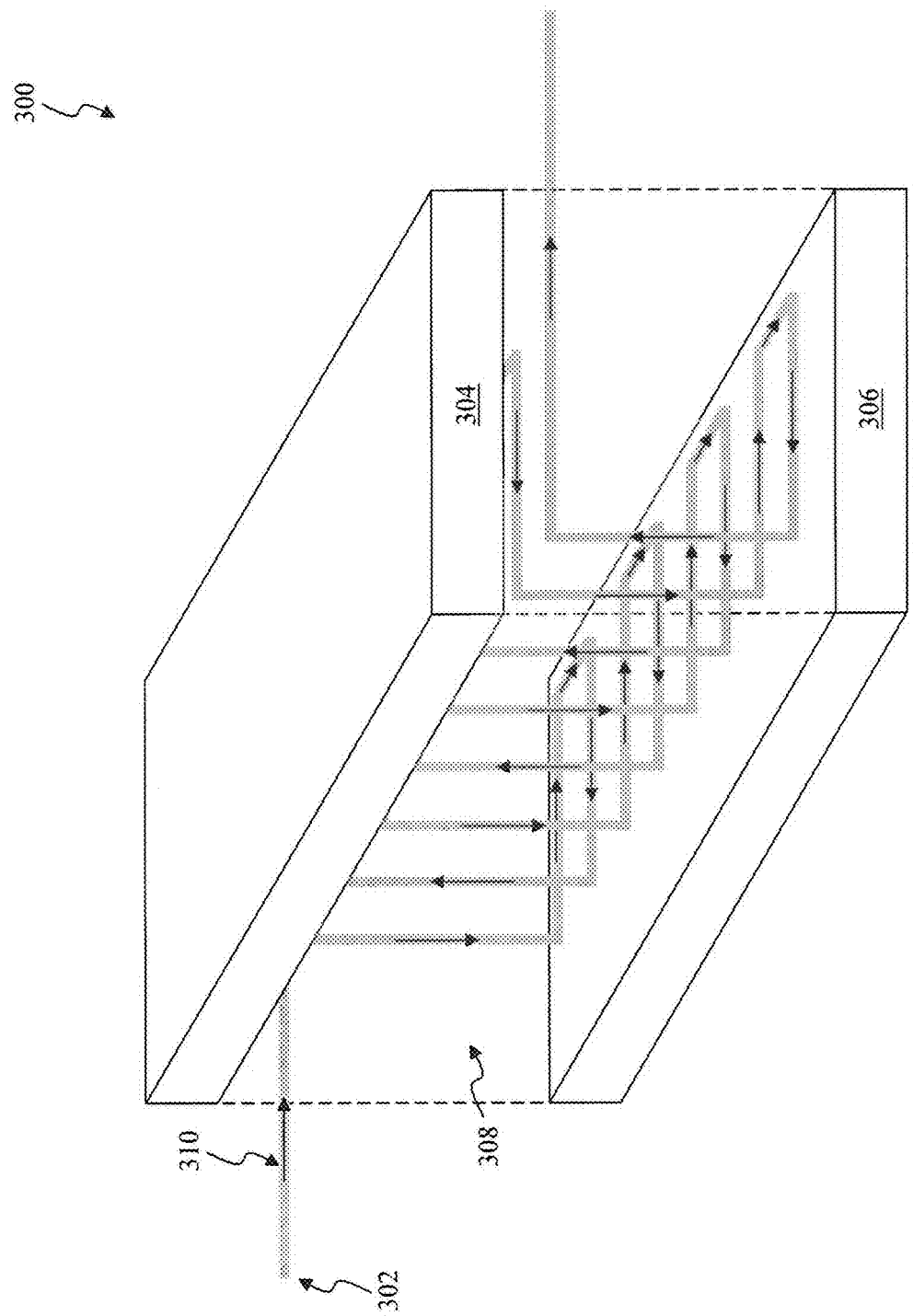
FIG. 3A illustrates a three-dimensional representation of a third exemplary magnetic thin film inductor structure having a magnetic thin film material according to an exemplary embodiment of the present disclosure.

FIG. 3A illustrates a three-dimensional representation of a third exemplary magnetic thin film inductor structure having a magnetic thin film material according to an exemplary embodiment of the present disclosure. A magnetic thin film inductor structure 300 represents a passive electrical energy storage device that stores electrical energy in a magnetic field in the presence of an electric current. In the exemplary embodiment illustrated in FIG. 3A, the magnetic thin film inductor structure 300 includes a conductive winding 302, a first magnetic thin film core structure 304, a second magnetic thin film core structure 306, and a dielectric region 308. In an exemplary embodiment, the magnetic thin film inductor structure 300 can be fabricated onto the semiconductor substrate using the semiconductor fabrication technique in a substantially similar manner as the magnetic thin film inductor structure 100 as discussed above in FIG. 1A.

As illustrated in FIG. 3A, the conductive winding 302 is wound within the dielectric region 308 forming multiple windings of the conductive winding 302 within the dielectric region 308. The number of windings of the conductive winding 302 within the dielectric region 308 and/or the separation between the windings of the conductive winding 302 within the dielectric region 308 as illustrated in FIG. 3A is for illustrative purposes only. Those skilled in the relevant art(s) will recognize other numbers of windings of the conductive winding 302 around within the dielectric region 308 and/or other separations between the windings of the conductive winding 302 are possible without departing from the spirit and scope of the present disclosure. In an exemplary embodiment, the conductive winding 302 is implemented using one or more conductive materials such as tungsten (W), aluminum (Al), copper (Cu), gold (Au), silver (Ag), or platinum (Pt) to provide some examples; however, those skilled in the relevant art(s) will recognize any suitable conductive material and/or combination of conductive materials can be used without departing from the spirit and scope of the present disclosure.

As additionally illustrated in FIG. 3A, the first magnetic thin film core structure 304 and the second magnetic thin film core structure 306 are situated above and below, respectively, the conductive winding 302. In some situations, the first magnetic thin film core structure 304 and/or the second magnetic thin film core structure 305 can contact the dielectric region 308. In the exemplary embodiment illustrated in FIG. 3A, the first magnetic thin film core structure 304 and the second magnetic thin film core structure 306 are implemented using the magnetic thin film (MTF) material as described above in FIG. 1A. In an exemplary embodiment, the first magnetic thin film core structure 304 and the second magnetic thin film core structure 306 can be implemented using the parallel MTF material as described above in FIG. 1A. During operation of the magnetic thin film inductor structure 300, the first magnetic thin film core structure 304 and the second magnetic thin film core structure 306 can be characterized as attracting magnetic flux lines generated by an electric current 310, passing through the conductive windings 302. This attraction of the magnetic flux lines lessens magnetic leakage resulting from the magnetic field generated by the magnetic thin film inductor structure 300 onto nearby electrical, mechanical, and/or electro-mechanical devices.

In an exemplary embodiment, the dielectric region 308 can include one or more dielectric materials such as silicon dioxide ($SiO_2$), nitride ($N^{3-}$), a high dielectric constant (high-κ) material having a large dielectric constant relative to silicon dioxide, such as aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), and/or a low-κ material having a small dielectric constant relative to silicon dioxide, to provide some examples. Alternatively, in another exemplary embodiment, the dielectric region 308 can include no dielectric materials. In this other exemplary embodiment, the dielectric region 308 can be characterized as being filled with air.

Figure 3B:
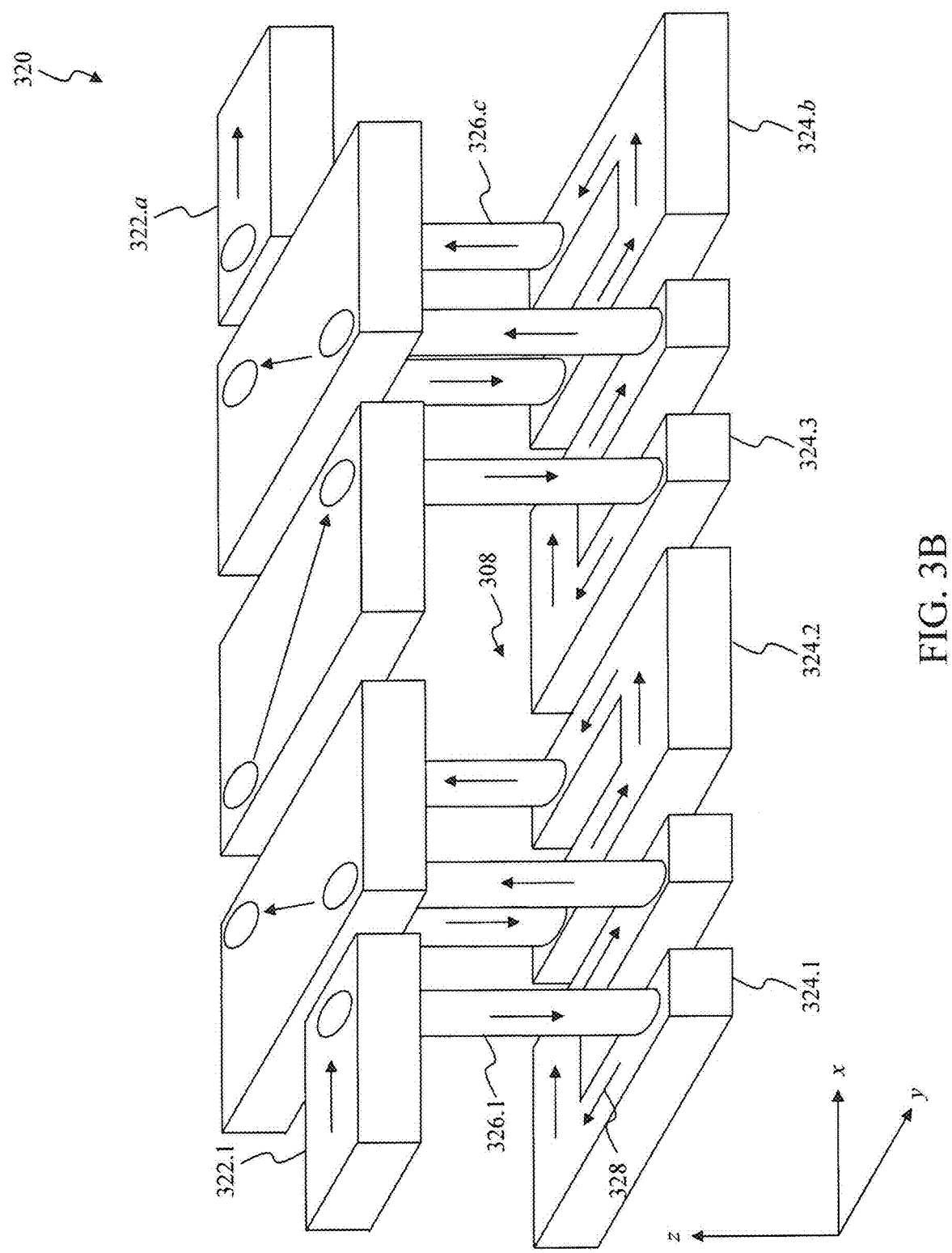
FIG. 3B illustrates a three-dimensional representation of a first exemplary implementation for the third exemplary magnetic thin film inductor structure according to an exemplary embodiment of the present disclosure.

FIG. 3B illustrates a three-dimensional representation of a first exemplary implementation for the third exemplary magnetic thin film inductor structure according to an exemplary embodiment of the present disclosure. A magnetic thin film inductor structure 320 represents a passive electrical energy storage device that stores electrical energy in a magnetic field in the presence of an electric current. In the exemplary embodiment illustrated in FIG. 3B, the magnetic thin film inductor structure 320 includes the dielectric region 308, a first group of metallic conductors 322.1 through 322.a, a second group of metallic conductors 324.1 through 324.b, and interconnections 326.1 through 326.c. The magnetic thin film inductor structure 320 can represent an exemplary embodiment of the magnetic thin film inductor structure 300.

As illustrated in FIG. 3B, the first group of metallic conductors 322.1 through 322.a, the second group of metallic conductors 324.1 through 324.b, and the interconnections 326.1 through 326.c are electrically and mechanically connected to form a conductive winding, such as the conductive winding 302 to provide an example, for the magnetic thin film inductor structure 320. This conductive winding is wound within the dielectric region 308 forming multiple windings of the conductive winding within the dielectric region 308. The number of windings of the conductive winding within the dielectric region 308 and/or the separation between the windings of the conductive winding within the dielectric region 308 as illustrated in FIG. 3B is for illustrative purposes only. Those skilled in the relevant art(s) will recognize other numbers of windings of the conductive winding around within the dielectric region 308 and/or other separations between the windings of the conductive winding 302 are possible without departing from the spirit and scope of the present disclosure. In an exemplary embodiment, the first group of metallic conductors 322.1 through 322.a are situated within a first conductive layer from among the one or more conductive layers of the semiconductor layer stack and the second group of metallic conductors 324.1 through 324.b are situated within a second conductive layer from among the one or more conductive layers of the semiconductor layer stack. In this exemplary embodiment, the interconnections 326.1 through 326.c electrically and mechanically connect the first group of metallic conductors 322.1 through 322.a in the first conductive layer with their corresponding second group of metallic conductors 324.1 through 324.b in the second conductive layer. However, those skilled in the relevant art(s) will recognize the first group of metallic conductors 322.1 through 322.a and the second group of metallic conductors 324.1 through 324.b can alternatively be implemented as one or more three-dimensional regular closed geometric structures, such as one or more three-dimensional regular polygons to provide an example, one or more three-dimensional irregular closed structures, such as one or more three-dimensional irregular polygons to provide an example, and/or any suitable combination of these closed structures without departing from the spirit and scope of the present disclosure. In an exemplary embodiment, the configuration and arrangement of the first group of metallic conductors 322.1 through 322.a and the second group of metallic conductors 324.1 through 324.h is pre-determined by a semiconductor technology node. For example, the first group of metallic conductors 322.1 through 322.a and the second group of metallic conductors 324.1 through 324.b as illustrated in FIG. 3B include three-dimensional rectangular structures. These three-dimensional rectangular structures are simpler to fabricate using the semiconductor technology node as opposed to other structures such as the one or more three-dimensional irregular closed structures as described above.

In the exemplary embodiment illustrated in FIG. 3B, the first group of metallic conductors 322.1 through 322.a and the second group of metallic conductors 324.1 through 324.b are configured and arranged to attract magnetic flux lines of a magnetic field generated by passing a current 328 through the magnetic thin film inductor structure 320. For example, as illustrated in FIG. 3B, the current 328 passes through the metallic conductor 322.1 along a positive "x" direction of a Cartesian coordinate system. Thereafter, the current 328 passes through the interconnection 326.1 along a negative "z" direction of the Cartesian coordinate system. Next, the current 328 passes through the metallic conductor 324.1 through a negative "y" direction of the Cartesian coordinate system, the positive "x" direction, and a positive "y" direction of the Cartesian coordinate system onto the interconnection 326.1. The current 328 passes through the remainder of the magnetic thin film inductor structure 320 as illustrated in FIG. 3B. As illustrated in FIG. 3B, the current 328 between adjacent metallic conductors from among the second group of metallic conductors 324.1 through 324.b, such as the current 328 between the conductors 324.1 and 324.2 and the current 328 between the conductors 324.2 and 324.3 to provide some examples, flows in substantially opposite directions. This opposite directional flow of the current 328 attracts the magnetic flux lines of the magnetic field.

Figure 3C:
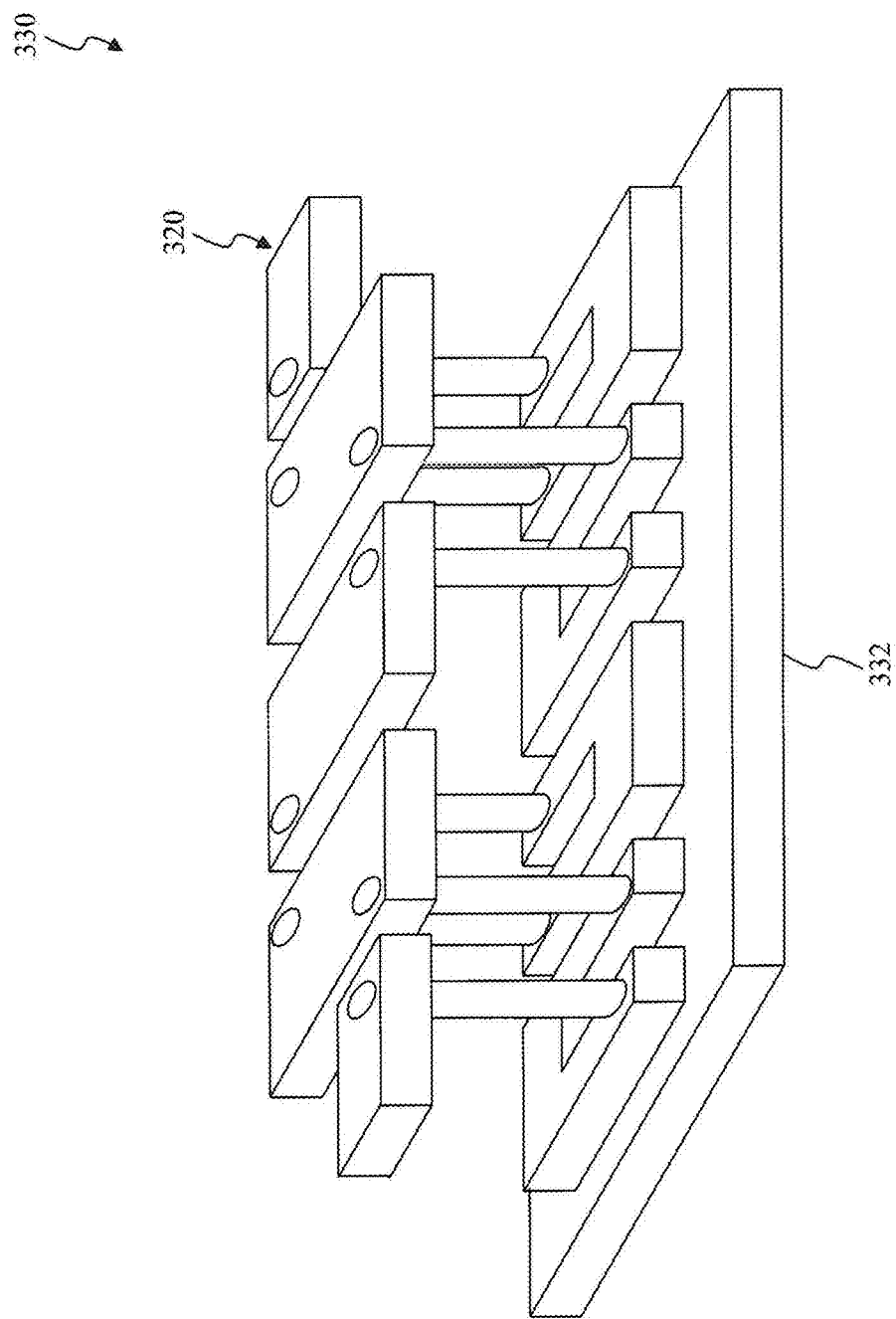
FIGS. 3C and 3D illustrate three-dimensional representations of second and third exemplary implementations for the third exemplary magnetic thin film inductor structure according to an exemplary embodiment of the present disclosure.
Figure 3D:
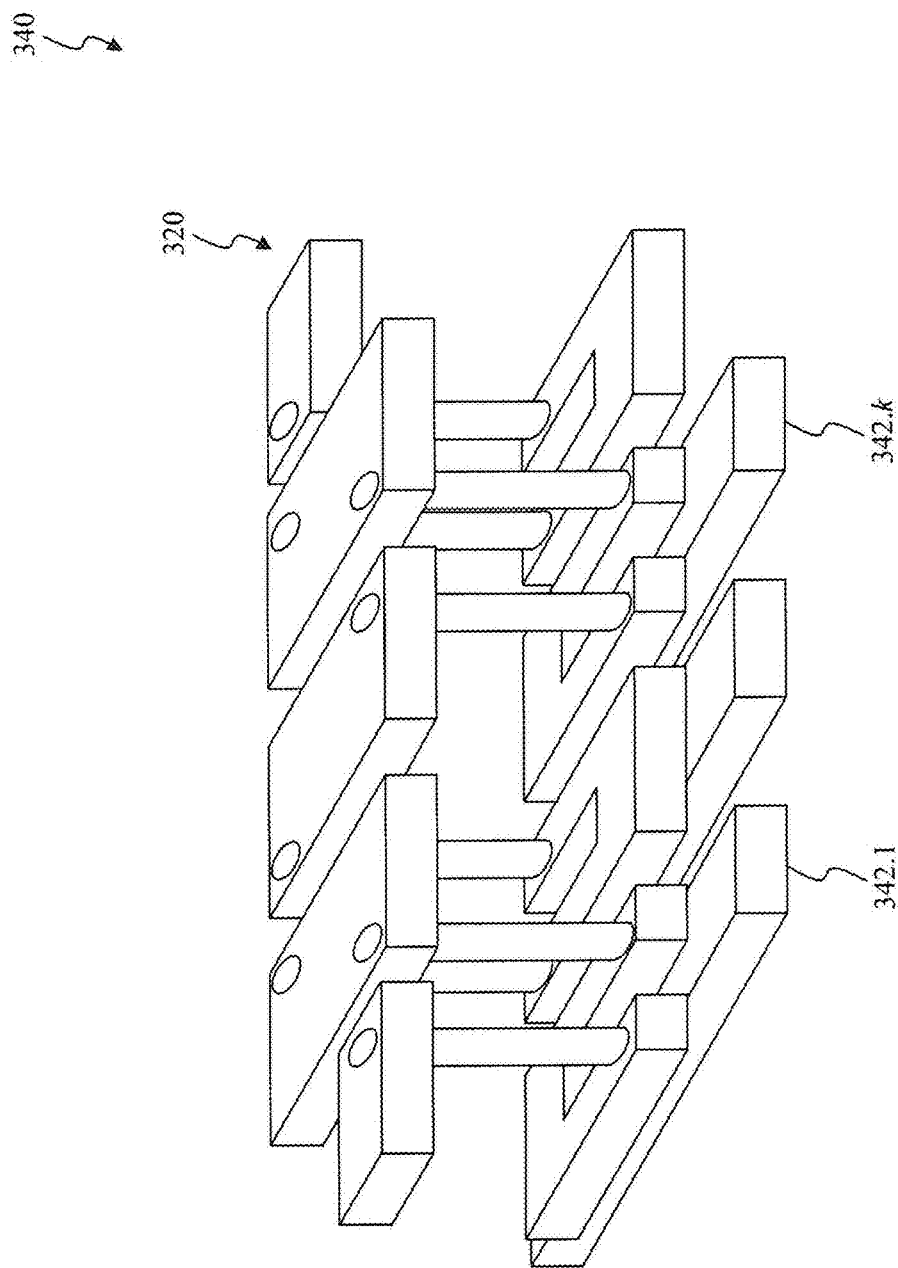

FIGS. 3C and 3D illustrate three-dimensional representations of second and third exemplary implementations for the third exemplary magnetic thin film inductor structure according to an exemplary embodiment of the present disclosure. As illustrated in FIG. 3C, a magnetic thin film inductor structure 330 represents a passive electrical energy storage device that stores electrical energy in magnetic fields in the presence of electric currents. In the exemplary embodiment illustrated in FIG. 3C, the magnetic thin film inductor structure 330 includes the magnetic thin film inductor structure 320 and a magnetic thin film planar structure 332. In an exemplary embodiment, the magnetic thin film inductor structure 330 can be fabricated onto the semiconductor substrate using the semiconductor fabrication technique in a substantially similar manner as the magnetic thin film inductor structure 100 as discussed above in FIG. 1A.

The magnetic thin film planar structure 332 can be characterized as further attracting magnetic flux lines of the magnetic field generated by the electric current passing through the magnetic thin film inductor structure 320. As illustrated in FIG. 3C, the magnetic thin film planar structure 332 is situated below the magnetic thin film inductor structure 320. Although not illustrated in FIG. 3C, those skilled in the relevant art(s) will recognize that another magnetic thin film planar structure similar to the magnetic thin film planar structure 332 can be alternatively, or additionally, situated above the magnetic thin film inductor structure 320 without departing from the spirit and scope of the present disclosure. Although the magnetic thin film planar structure 332 is illustrated as being a rectangular parallelepipeds in FIG. 3C, those skilled in the relevant art(s) will recognize that other implementations, such as one or more three-dimensional regular closed geometric structures, such as one or more three-dimensional regular polygons to provide an example, one or more three-dimensional irregular closed structures, such as one or more three-dimensional irregular polygons to provide an example, and/or any suitable combination of these closed structures, are possible without departing from the spirit and scope of the present disclosure. In an exemplary embodiment, the magnetic thin film planar structure 332 can be implemented using the MTF material and/or the parallel MTF material as described above in FIG. 1A. In some situations, the MTF material can be deposited onto the one or more ferromagnetic, ferrimagentic, and/or paramagnetic materials as described above in FIG. 1A. In some situations, one or more eddy currents can form on one or more surfaces of the magnetic thin film planar structure 332 during operation of the magnetic thin film inductor structure 320. To lessen these eddy currents, the magnetic thin film planar structure 332 as shown in FIG. 3C can be divided into the magnetic thin film planar structures 342.1 through 342.k which is to be discussed in further detail below in FIG. 3D.

As illustrated in FIG. 3D, a magnetic thin film inductor structure 340 represents a passive electrical energy storage device that stores electrical energy in magnetic fields in the presence of electric currents. In the exemplary embodiment illustrated in FIG. 3D, the magnetic thin film inductor structure 340 includes the magnetic thin film inductor structure 320 and the magnetic thin film planar structures 342.1 through 342.k. In an exemplary embodiment, the magnetic thin film inductor structure 340 can be fabricated onto the semiconductor substrate using the semiconductor fabrication technique in a substantially similar manner as the magnetic thin film inductor structure 100 as discussed above in FIG. 1A.

The magnetic thin film planar structures 342.1 through 342.k can be characterized as further attracting magnetic flux lines of the magnetic field generated by the electric current passing through the magnetic thin film inductor structure 320. As illustrated in FIG. 3D, the magnetic thin film planar structures 342.1 through 342.k are situated below the magnetic thin film inductor structure 320. Although not illustrated in FIG. 3D, those skilled in the relevant art(s) will recognize that other magnetic thin film planar structures similar to the magnetic thin film planar structures 342.1 through 342.k can be alternatively, or additionally, situated above the magnetic thin film inductor structure 320 without departing from the spirit and scope of the present disclosure. Although the magnetic thin film planar structures 342.1 through 342.k are illustrated as being rectangular parallelepipeds in FIG. 1C, those skilled in the relevant art(s) will recognize that other implementations, such as one or more three-dimensional regular closed geometric structures, such as one or more three-dimensional regular polygons to provide an example, one or more three-dimensional irregular closed structures, such as one or more three-dimensional irregular polygons to provide an example, and/or any suitable combination of these closed structures, are possible without departing from the spirit and scope of the present disclosure. In an exemplary embodiment, the magnetic thin film planar structures 342.1 through 342.k can be implemented using the MTF material and/or the parallel MTF material as described above in FIG. 1A. In some situations, the MTF material can be deposited onto the one or more ferromagnetic, ferrimagentic, and/or paramagnetic materials as described above in FIG. 1A.

CONCLUSION

The foregoing Detailed Description discloses a first magnetic thin film inductor structure. The first magnetic thin film inductor structure includes a magnetic thin film core structure and a conductive winding. The magnetic thin film core structure includes a magnetic thin film core, a first magnetic thin film core extension, and a second magnetic thin film core extension, the first magnetic thin film core extension and the second magnetic thin film core extension being situated around a periphery of the magnetic thin film core structure. The conductive winding is wound around the magnetic thin film core to form multiple windings for the first magnetic thin film inductor structure.

The foregoing Detailed Description also discloses a second magnetic thin film inductor structure. The second magnetic thin film inductor structure includes magnetic thin film core structures and a conductive winding. The magnetic thin film core structures electrically and mechanically are connected to each other and include magnetic thin film cores, first magnetic thin film core extensions, and second magnetic thin film core extensions, the first magnetic thin film core extensions and the second magnetic thin film core extensions being situated around peripheries of corresponding magnetic thin film cores from among the magnetic thin film cores. The conductive is winding wound around at least one magnetic thin film core from among the magnetic thin film cores to form one or more windings for the second magnetic thin film inductor structure.

The foregoing Detailed Description also further discloses a third magnetic thin film inductor structure. The third magnetic thin film inductor structure includes a magnetic thin film core structure and a conductive winding. The magnetic thin film core structure includes a magnetic thin film core, a first magnetic thin film core extension, and a second magnetic thin film core extension. The conductive winding is wound around the magnetic thin film core to form one or more windings for the third magnetic thin film inductor structure. The first magnetic thin film core extension and the second magnetic thin film core extension attract magnetic flux lines of a magnetic field generated by passing a current through the conductive winding.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A magnetic thin film inductor structure, comprising:
   a magnetic thin film core structure including a magnetic thin film core, a first magnetic thin film core extension, and a second magnetic thin film core extension, the first magnetic thin film core extension and the second magnetic thin film core extension being situated around a periphery of the magnetic thin film core;
   a conductive winding wound around the magnetic thin film core to form one or more windings for the magnetic thin film inductor structure; and
   a first magnetic thin film planar structure situated above the magnetic thin film core structure, the first magnetic thin film planar structure including:
      a first thin film planar structure from among a first plurality of thin film planar structures having a width that is substantially similar to a width of the first magnetic thin film core extension;
      a second thin film planar structure from among the first plurality of thin film planar structures having a width that is substantially similar to a width of the magnetic thin film core structure; and
      a third thin film planar structure from among the first plurality of thin film planar structures having a width that is substantially similar to a width of the second magnetic thin film core extension,
      wherein the first thin film planar structure, the second thin film planar structure, and the third thin film planar structure are spaced apart from one another without connecting to one another above the magnetic thin film core structure.

2. The magnetic thin film inductor structure of claim 1, wherein the magnetic thin film core, the first magnetic thin film core extension, and the second magnetic thin film core extension comprise:
   a magnetic thin film (MTF) material.

3. The magnetic thin film inductor structure of claim 2, wherein the MTF material comprises:
   a parallel MTF material.

4. The magnetic thin film inductor structure of claim 1, wherein the first magnetic thin film core extension and the second magnetic thin film core extension are C-shaped.

5. The magnetic thin film inductor structure of claim 1, further comprising:
   a first intervening dielectric region situated between the first magnetic thin film core extension and the magnetic thin film core; and
   a second intervening dielectric region situated between the second magnetic thin film core extension and the magnetic thin film core.

6. The magnetic thin film inductor structure of claim 5, wherein at least one of: the first intervening dielectric region and the second intervening dielectric region comprises:
   air.

7. The magnetic thin film inductor structure of claim 1, further comprising:
   a second magnetic thin film planar structure situated below the magnetic thin film core structure.

8. The magnetic thin film inductor structure of claim 7, wherein at least one of: the first magnetic thin film planar structure and the second magnetic thin film planar structure comprises:
   a magnetic thin film (MTF) material.

9. The magnetic thin film inductor structure of claim 7, wherein the second magnetic thin film planar structure comprises:
   a fourth thin film planar structure from among a second plurality of thin film planar structures having a width that is substantially similar to the width of the first magnetic thin film core extension;
   a fifth thin film planar structure from among the second plurality of thin film planar structures having a width that is substantially similar to the width of the magnetic thin film core structure; and
   a sixth thin film planar structure from among the second plurality of thin film planar structures having a width that is substantially similar to the width of the second magnetic thin film core extension.

10. A magnetic thin film inductor structure, comprising:
   a magnetic thin film core structure including a magnetic thin film core, a first magnetic thin film core extension, and a second magnetic thin film core extension;
   a conductive winding wound around the magnetic thin film core to form one or more windings for the magnetic thin film inductor structure; and
   a first magnetic thin film planar structure situated above the magnetic thin film core structure, the first magnetic thin film planar structure including a plurality of thin film planar structures that are spaced apart from one another without connecting to one another above the magnetic thin film core structure, wherein the first magnetic thin film core extension and the second magnetic thin film core extension are configured to attract a plurality of magnetic flux lines of a magnetic field generated by passing a current through the conductive winding.

11. The magnetic thin film inductor structure of claim 10, wherein the magnetic thin film core, the first magnetic thin film core extension, and the second magnetic thin film core extension comprise:

a magnetic thin film (MTF) material.

12. The magnetic thin film inductor structure of claim 11, wherein the MTF material comprises:

a parallel MTF material.

13. The magnetic thin film inductor structure of claim 10, further comprising:

a first intervening dielectric region situated between the first magnetic thin film core extension and the magnetic thin film core; and a second intervening dielectric region situated between the second magnetic thin film core extension and the magnetic thin film core.

14. The magnetic thin film inductor structure of claim 10, further comprising:

a second magnetic thin film planar structure situated below the magnetic thin film core structure.

15. The magnetic thin film inductor structure of claim 1, wherein the conductive winding is wound only around the magnetic thin film core to form the one or more windings.

16. The magnetic thin film inductor structure of claim 10, wherein the conductive winding is wound only around the magnetic thin film core to form the one or more windings.

17. A magnetic thin film inductor structure, comprising:

a magnetic thin film core structure including a magnetic thin film core, a first magnetic thin film core extension, and a second magnetic thin film core extension, the first magnetic thin film core extension and the second magnetic thin film core extension being situated around a periphery of the magnetic thin film core;

a first magnetic thin film planar structure situated above the magnetic thin film core structure;

a first intervening dielectric region situated between the first magnetic thin film core extension and the magnetic thin film core;

a second intervening dielectric region situated between the second magnetic thin film core extension and the magnetic thin film core; and a conductive winding wound only around the magnetic thin film core to form one or more windings for the magnetic thin film inductor structure.

18. The magnetic thin film inductor structure of claim 17, further comprising:

a second magnetic thin film planar structure situated below the magnetic thin film core structure.

19. The magnetic thin film inductor structure of claim 18, wherein at least one of: the first magnetic thin film planar structure and the second magnetic thin film planar structure comprises:

a first thin film planar structure from among a plurality of thin film planar structures having a width that is substantially similar to a width of the first magnetic thin film core extension;

a second thin film planar structure from among the plurality of thin film planar structures having a width that is substantially similar to a width of the magnetic thin film core structure; and a third thin film planar structure from among the plurality of thin film planar structures having a width that is substantially similar to a width of the second magnetic thin film core extension, wherein the first thin film planar structure, the second thin film planar structure, and the third thin film planar structure are spaced apart from one another without connecting to one another above the magnetic thin film core structure.

* * * * *